US006627935B2

(12) United States Patent
Kowarik et al.

(10) Patent No.: US 6,627,935 B2
(45) Date of Patent: Sep. 30, 2003

(54) RESISTIVE FERROELECTRIC MEMORY CELL

(75) Inventors: Oskar Kowarik, Neubiberg (DE); Kurt Hoffman, Taufkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 103 days.

(21) Appl. No.: 09/767,806

(22) Filed: Jan. 22, 2001

(65) Prior Publication Data

US 2001/0038109 A1 Nov. 8, 2001

Related U.S. Application Data

(63) Continuation of application No. PCT/DE99/00921, filed on Mar. 25, 1999.

(30) Foreign Application Priority Data

Jul. 22, 1998 (DE) ........................................ 198 32 993

(51) Int. Cl.[7] ......................... H01L 29/76; H01L 29/94; H01L 31/119; H01L 27/108; H01L 29/00

(52) U.S. Cl. ....................................... 257/296; 257/532

(58) Field of Search ................................ 257/295–310, 257/532; 438/241–254

(56) References Cited

U.S. PATENT DOCUMENTS 4,712,876 A 12/1987 Umeda et al.
6,323,513 B1 * 11/2001 Schindler et al. ........... 257/296

FOREIGN PATENT DOCUMENTS

WO WO 99/14761 3/1999

* cited by examiner

*Primary Examiner*—Cuong Quang Nguyen
(74) *Attorney, Agent, or Firm*—Laurence A. Greenberg; Werner H. Stemer; Ralph E. Locher

(57) ABSTRACT

A resistive ferroelectric memory cell includes a selection transistor having first and second zones of a first conduction type. A storage capacitor has one electrode at a fixed cell-plate voltage and another electrode connected to the first zone of the selection transistor. A semiconductor substrate has a second conduction type opposite the first conduction type. The storage capacitor and the selection transistor are disposed in the semiconductor substrate. A resistor is disposed between the other electrode of the storage capacitor and the fixed cell-plate voltage. The resistor has a resistance R2 such that R3<<R2<<R1, in which R1 is a reverse resistance of a pn junction between the first zone of the selection transistor and the semiconductor substrate and R3 is a resistance between the first zone and the second zone of the selection transistor, in a turned-on state.

8 Claims, 2 Drawing Sheets

RESISTIVE FERROELECTRIC MEMORY CELL

CROSS-REFERENCE TO RELATED APPLICATION

This application is a continuation of copending International Application No. PCT/DE99/00921, filed Mar. 25, 1999, which designated the United States.

SUMMARY OF THE INVENTION

The present invention relates to a resistive ferroelectric memory cell including a selection transistor and a storage capacitor. The storage capacitor has one electrode at a fixed cell-plate voltage and another electrode connected to a first zone of the selection transistor having a first conduction type. The selection transistor and the storage capacitor are disposed in a semiconductor substrate of a second conduction type opposite to the first conduction type.

Ferroelectric storage configurations, in which the cell-plate voltage is set firmly to half the supply voltage (Vcc/2) of the storage configuration, are distinguished by fast storage operations. However, in the case of those storage configurations, a problem which occurs is that of a possible loss of data stored in the storage capacitors: since cell nodes at the storage capacitors are floating as long as the selection transistors are off, and those cell nodes form parasitic pn junctions in relation to the semiconductor substrate, leakage currents which necessarily occur through those pn junctions cause the cell-node voltage to fall to the ground voltage Vss. In that case other nodes of the ferroelectric storage capacitors remain at the fixed cell-plate voltage Vcc/2. As a result, the content of the ferroelectric storage capacitors can be destroyed by reprogramming.

In order to avoid that data loss, the memory cells are refreshed, in a similar way to that in the case of DRAMs, before their content is destroyed. Refreshing is carried out by bit lines of the storage configuration being precharged to half the supply voltage Vcc/2 and the cell nodes likewise being charged up to half the supply voltage Vcc/2 by activating the word lines, so that zero volts drop across the storage capacitors.

Refreshing in that way is complicated and requires additional operations, which should be avoided as far as possible.

SUMMARY OF THE INVENTION

It is accordingly an object of the invention to provide a resistive ferroelectric memory cell, which overcomes the hereinafore-mentioned disadvantages of the heretofore-known devices of this general type and which is configured in such a way that a leakage current at a cell node can no longer cause reprogramming of the memory cell, so that it is possible to dispense with refreshing the memory cell.

With the foregoing and other objects in view there is provided, in accordance with the invention, a resistive ferroelectric memory cell, comprising a selection transistor having first and second zones of a first conduction type. A storage capacitor has one electrode at a fixed cell-plate voltage and another electrode connected to the first zone of the selection transistor. A semiconductor substrate has a second conduction type opposite the first conduction type. The storage capacitor and the selection transistor are disposed in the semiconductor substrate. A resistor is disposed between the other electrode of the storage capacitor and the fixed cell-plate voltage. The resistor has a resistance R2 such that R3<<R2<<R1, in which R1 is a reverse resistance of a pn junction between the first zone of the selection transistor and the semiconductor substrate and R3 is a resistance between the first zone and the second zone of the selection transistor, in a turned-on state.

In this way a resistive connection between the floating cell node and the outer node of the storage capacitor is produced in the memory cell according to the invention, so that the leakage current of the parasitic pn junction is compensated for and approximately the cell-plate voltage (Vcc/2) is present at both electrodes of the storage capacitor. Therefore, unintentional reprogramming of the storage capacitor can no longer take place. It should further be noted that the resistance of the blocked, switched-off selection transistor can still be present in parallel in this case. However, as a rule this resistance is very small.

In the memory cell according to the invention, it is essential that:

(a) the resistance of the resistor is significantly lower than the reverse resistance of the pn junction; and (b) the floating cell node is pulled up to the cell-plate voltage in a shorter time than the refresh time which is otherwise needed.

In the resistive ferroelectric memory cell according to the invention, it is firstly ensured that the reading and writing operation is virtually undisturbed by the resistance. It is secondly ensured that the leakage current of the parasitic pn junction is compensated for by the resistor, and approximately the cell-plate voltage is present on both sides of the ferroelectric storage capacitor. Therefore, unintentional reprogramming of the storage capacitor can no longer take place.

In accordance with another feature of the invention, the first zone of the selection transistor is preferably the drain zone, but if appropriate can also be the source zone.

In accordance with a further feature of the invention, the resistor is provided as a thick oxide transistor between the first zone of the selection transistor and a highly doped zone of the first conduction type in the semiconductor substrate.

In accordance with an added feature of the invention, the resistor is provided by a weakly doped region of the first conduction type between the first zone of the selection transistor and a highly doped zone of the first conduction type in the semiconductor substrate.

In accordance with an additional feature of the invention, in both of the above-described optional embodiments for the resistor, the highly doped zone of the first conduction type is connected to the one electrode of the storage capacitor through a contact plug, for example made of doped polycrystalline silicon or aluminum.

In accordance with yet a concomitant feature of the invention, the resistor is formed directly between the one electrode and the other electrode of the storage capacitor. In this case, the resistor can be a high-resistance polycrystalline resistor.

In the resistive memory cell according to the invention, it is particularly advantageous that unintended reprogramming of its memory content as a result of a leakage current through the parasitic pn junction between the first zone and the region surrounding the latter, that is to say, for example, the semiconductor substrate, is excluded. In addition, it is readily possible to use a normal word-line decoder. Nor is the capacity of the word lines enlarged. Finally, even when the supply voltage is switched off, no unintentional reprogramming of the storage content of the memory cell will take place.

Other features which are considered as characteristic for the invention are set forth in the appended claims.

Although the invention is illustrated and described herein as embodied in a resistive ferroelectric memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
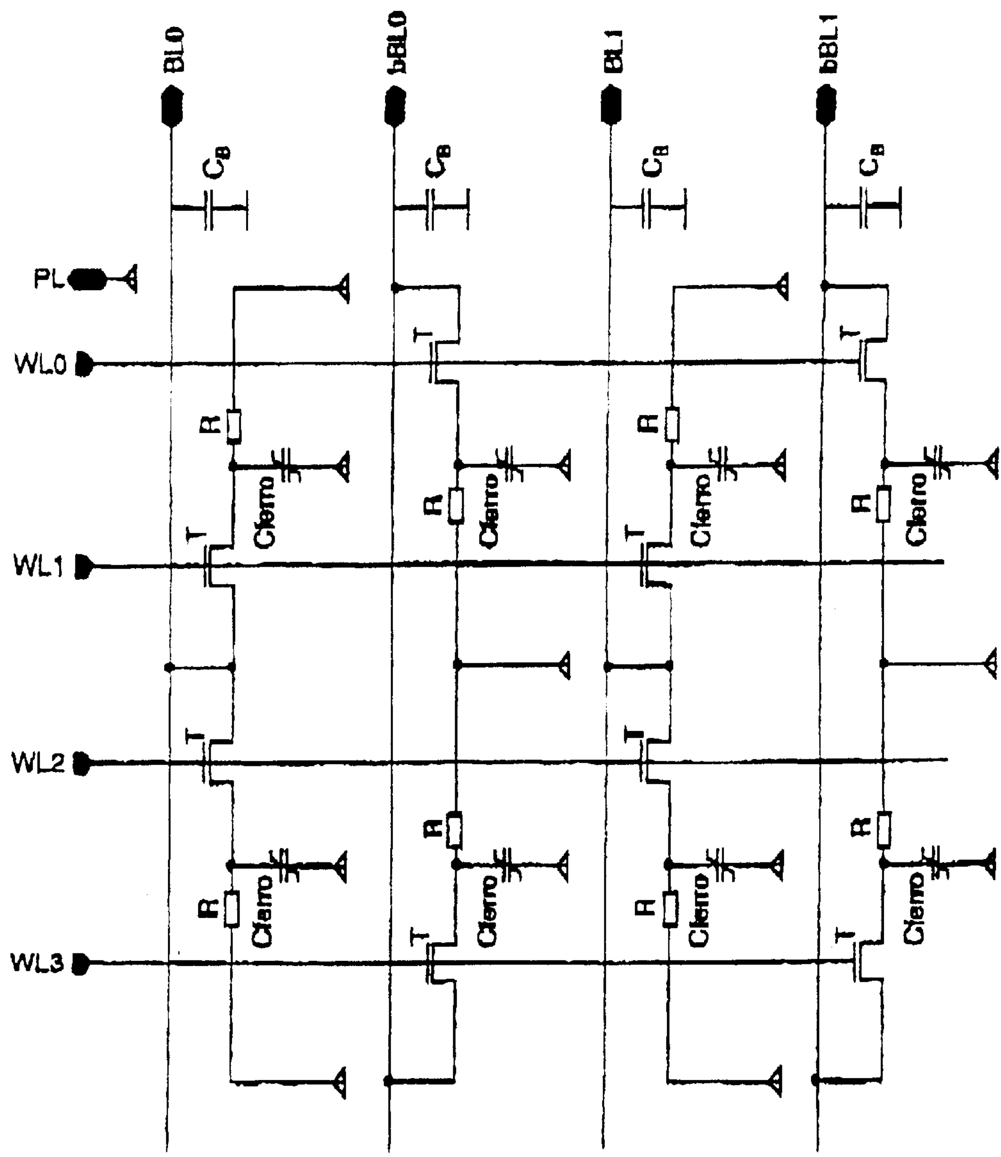
FIG. 1 is a schematic circuit diagram of a memory cell field with memory cells according to the invention.

Referring now to the figures of the drawings in detail and first, particularly, to FIG. 1 thereof, there is seen a memory cell field in folded bit-line architecture with word lines WL0, WL1, WL2 and WL3 and bit lines BL0, bBL0, BL1 and bBL1 having capacitors $C_B$ for single-transistor/single-capacitor (1T1C) memory cells including selection transistors T and ferroelectric storage capacitors Cferro.

A fixed cell-plate voltage is applied to one electrode of the storage capacitors Cferro. According to the invention, the fixed cell-plate voltage is also supplied in each case, through a resistor R, to the other electrode of the storage capacitor.

A resistance R2 of this resistor R is such that $$R3 << R2 << R1,$$

where R1 is a reverse resistance of a pn junction of the selection transistor T, and R3 is a resistance between a drain and a source of the selection transistor T in a turned-on state.

A connection between the two electrodes of the storage capacitor is therefore made through the resistor R in such a way that the resistance R2 of this resistor is significantly lower than the value R1 of the reverse resistance of the pn junction, and the floating electrode is pulled up to the cell-plate voltage in a shorter time than a refresh time that is otherwise needed.

Some possible configurations for the resistance will be explained in the following text, using FIGS. 2 to 4. Mutually corresponding components are provided with the same reference symbols in each case.

Figure 2:
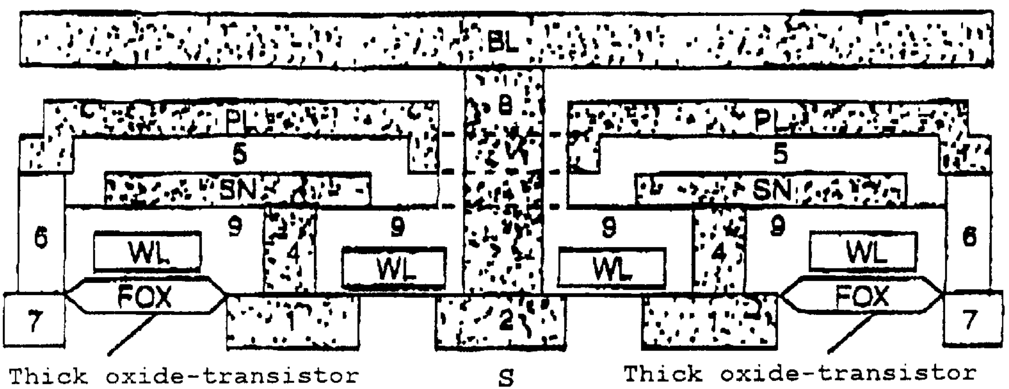
FIG. 2 is a diagrammatic, sectional view of a first exemplary embodiment of the invention with a thick oxide transistor as a resistor.

FIG. 2 shows an n-conductive (for example) drain zone 1 and a likewise n-conductive source zone 2 in a p-conductive semiconductor substrate S which is formed, for example, of silicon. Of course, the specified conduction types as well as those in the following text, can be reversed. In this case as well, the term "semiconductor substrate" is to be understood to mean a region surrounding the zones 1, 2. This region can also be a trough or the like. In addition other semiconductor materials can, of course, be used, as well as silicon.

The drain zone 1 is connected to a plug 4 made of doped polycrystalline silicon or aluminum, for example. The plug 4 is disposed in an insulating layer 9 made of silicon dioxide and/or silicon nitride, for example. The plug 4 is connected to an electrode SN of a ferroelectric storage capacitor. The storage capacitor has another electrode PL which is at a fixed cell-plate voltage and a ferroelectric dielectric 5. A bit line BL is connected to the source zone 2 through a contact plug 8 made of doped polycrystalline silicon, for example. Word lines WL are embedded in the insulating layer 9 in the region between the drain zone 1 and the source zone 2 in order to form gates of the selection transistors. Word lines WL are also embedded in the insulating layer 9 above a field oxide FOX made of silicon dioxide.

The electrode PL is connected through a contact plug 6 made of doped polycrystalline silicon, for example, to an n-conductive, highly doped zone 7 in a surface region of the semiconductor substrate S. This produces a thick oxide transistor which is disposed underneath the field oxide FOX and acts as a resistor R in a sub-threshold-current range and has the resistance R2 which has to be dimensioned in the manner specified above. The electrode PL is therefore connected through the contact plug 6 to the zone 7. The zone 7 is connected to the electrode SN, which floats in the turned-off state, through the thick oxide transistor, the drain zone 1 and the contact plug 4. The threshold voltage of the thick oxide transistor is set, for example, by appropriate doping under the field oxide FOX. That threshold voltage is set to be so high that the resistance R2 of the thick oxide transistor meets the conditions specified above for all of the word-line voltages which occur.

Figure 3:
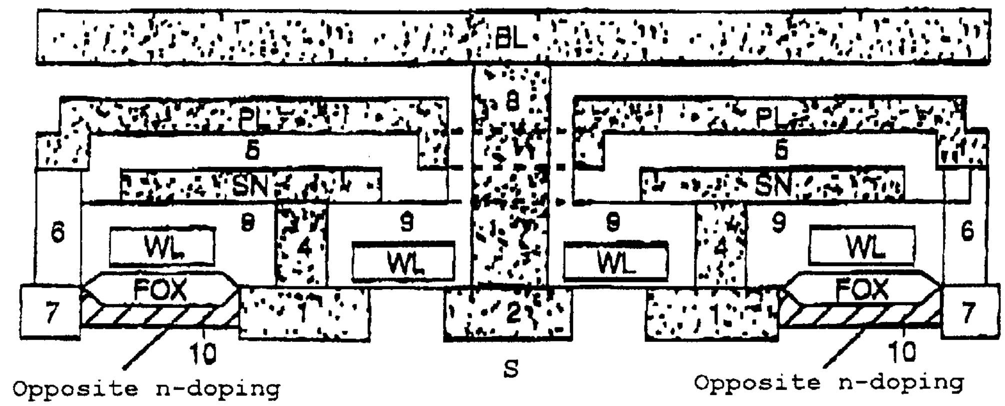
FIG. 3 is a diagrammatic, sectional view of a second exemplary embodiment of the invention with opposite doping in a surface of the semiconductor substrate as a resistor.

FIG. 3 shows another exemplary embodiment of the invention, which differs from the exemplary embodiment of FIG. 2 in that the resistor R is formed by a weakly oppositely doped n-conductive region 10 under the field oxide FOX.

Figure 4:
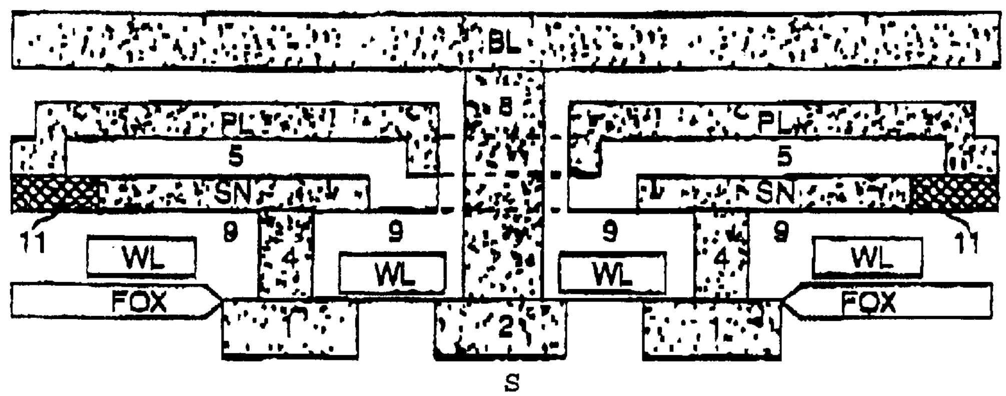
FIG. 4 is a diagrammatic, sectional view of a third exemplary embodiment of the invention with a high-resistance resistor made of polycrystalline silicon between electrodes of a storage capacitor.

Finally, FIG. 4 shows an exemplary embodiment in which the resistor R is implemented through the use of a high-resistance connection 11, made of polycrystalline silicon, for example, between the electrode PL and the floating electrode SN.

In all of the above-described exemplary embodiments of FIGS. 2 to 4, the resistance R2 of the resistor R has to be such that it meets the specified conditions. This provides a resistive ferroelectric memory cell in which the content of the storage capacitor cannot be destroyed by reprogramming, even without any refresh.

We claim:

1. A resistive ferroelectric memory cell, comprising:

a selection transistor having first and second zones of a first conduction type;

a storage capacitor having one electrode at a fixed cell-plate voltage and another electrode connected to said first zone of said selection transistor;

a semiconductor substrate of a second conduction type opposite the first conduction type, said storage capacitor and said selection transistor disposed in said semiconductor substrate, defining a pn junction between said first zone of said selection transistor and said semiconductor substrate;

a resistor disposed between the other electrode of said storage capacitor and the one electrode at the fixed cell-plate voltage, said resistor having a resistance R2 such that:

$$R3 << R2 << R1,$$

in which;

R1 is a reverse resistance of said pn junction between said first zone of said selection transistor and said semiconductor substrate; and R3 is a resistance between said first zone and said second zone of said selection transistor, in a turned-on state.

2. The resistive ferroelectric memory cell according to claim 1, wherein said first zone of said selection transistor is a drain zone.

3. The resistive ferroelectric memory cell according to claim 1, including a highly doped zone of the first conduction type disposed in said semiconductor substrate, said resistor being a thick oxide transistor between said first zone of said selection transistor and said highly doped zone.

4. The resistive ferroelectric memory cell according to claim 1, including a highly doped zone of the first conduction type disposed in said semiconductor substrate, said resistor being a weakly doped region of the first conduction type between said first zone of said selection transistor and said highly doped zone.

5. The resistive ferroelectric memory cell according to claim 3, including a contact plug connected between said highly doped zone of the first conduction type and said one electrode of said storage capacitor.

6. The resistive ferroelectric memory cell according to claim 4, including a contact plug connected between said highly doped zone of the first conduction type and said one electrode of said storage capacitor.

7. The resistive ferroelectric memory cell according to claim 1, wherein said resistor is formed directly between said one electrode and said other electrode of said storage capacitor.

8. The resistive ferroelectric memory cell according to claim 7, wherein said resistor is a high-resistance polycrystalline resistor.

* * * * *

UNITED STATES PATENT AND TRADEMARK OFFICE

CERTIFICATE OF CORRECTION

PATENT NO. : 6,627,935 B2
DATED : September 30, 2003
INVENTOR(S) : Oskar Kowarik et al.

It is certified that error appears in the above-identified patent and that said Letters Patent is hereby corrected as shown below:

Title page,
Item [73], Assignee, should read as follows: -- Infineon Technologies AG, München (DE) --

Signed and Sealed this

Tenth Day of February, 2004

JON W. DUDAS
*Acting Director of the United States Patent and Trademark Office*